(12) United States Patent
Chen et al.

(10) Patent No.: US 7,538,025 B2
(45) Date of Patent: May 26, 2009

(54) DUAL DAMASCENE PROCESS FLOW FOR POROUS LOW-K MATERIALS

(75) Inventors: Chao-Cheng Chen, Chong-Ling (TW);
Chen-Nan Yeh, Hsi-chi (TW);
Chien-Chung Fu, Sanchong (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 860 days.

(21) Appl. No.: 10/714,304

(22) Filed: Nov. 14, 2003

(65) Prior Publication Data

US 2005/0106856 A1 May 19, 2005

(51) Int. Cl.
*H01L 21/4763* (2006.01)
(52) U.S. Cl. ............... 438/636; 438/634; 257/E21.579
(58) Field of Classification Search .............. 438/634, 438/636, FOR. 355, FOR. 489, 637, 638; 257/E21.579
See application file for complete search history.

(56) References Cited

U.S. PATENT DOCUMENTS

| | | | |
|---|---|---|---|
| 6,287,955 B1 | 9/2001 | Wang et al. | 438/623 |
| 6,291,887 B1 | 9/2001 | Wang et al. | 257/758 |
| 6,300,235 B1 | 10/2001 | Feldner et al. | 438/618 |
| 6,350,681 B1 | 2/2002 | Chen et al. | 438/637 |
| 6,548,401 B1 * | 4/2003 | Trivedi | 438/638 |
| 2003/0054629 A1 * | 3/2003 | Kawai et al. | 438/622 |
| 2003/0170978 A1 * | 9/2003 | Lee | 438/638 |
| 2004/0018721 A1 * | 1/2004 | Kim et al. | 438/637 |
| 2004/0166669 A1 * | 8/2004 | Saito | 438/638 |

FOREIGN PATENT DOCUMENTS

JP       2002093901 A  *  3/2002

* cited by examiner

*Primary Examiner*—Michelle Estrada
(74) *Attorney, Agent, or Firm*—Haynes and Boone, LLP

(57) ABSTRACT

A method of forming a dual damascene opening comprising the following steps. A structure having an overlying exposed conductive layer formed thereover is provided. A dielectric layer is formed over the exposed conductive layer. An anti-reflective coating layer is formed over the dielectric layer. The anti-reflective layer and the dielectric layer are etched using a via opening process to form an initial via exposing a portion of the conductive layer. A protective film portion is formed over at least the exposed portion of the conductive layer. The anti-reflective coating layer and the dielectric layer are patterned to reduce the initial via to a reduced via and to form a trench opening substantially centered over the reduced via. The trench opening and the reduced via comprising the dual damascene opening.

39 Claims, 3 Drawing Sheets

DUAL DAMASCENE PROCESS FLOW FOR POROUS LOW-K MATERIALS

FIELD OF THE INVENTION

The present invention relates generally to semiconductor fabrication and more specifically to methods of dual damascene patterning.

BACKGROUND OF THE INVENTION

For porous low-k dielectric materials, traditional dual damascene patterning processes normally suffer surface roughness issues which will induce metallization issues. The major contribution to this surface roughness derives from the liner removal process (LRM). A trade-off between a sufficient LRM etch rate to open the stop layer and the dual damascene porous low-k surface roughness is very difficult to resolve.

U.S. Pat. No. 6,350,681 B1 to Chen et al. describes a dual damascene comprising an etch via and an etch trench.

U.S. Pat. No. 6,291,887 B1 to Wang et al. describes a dual damascene with low-k layers comprising an etch via and an etch trench with a nitride middle etch stop layer.

U.S. Pat. No. 6,287,955 B1 to Wang et al. describes a dual damascene with multiple low-k intermetal dielectric layers comprising an etch via and an etch trench.

U.S. Pat. No. 6,300,235 B1 to Feldner et al. describes a dual damascene with low-k layers comprising an etch via and an etch trench with sacrificial flowable oxide.

SUMMARY OF THE INVENTION

Accordingly, it is an object of one or more embodiments of the present invention to provide a method of patterning dual damascene openings.

Other objects will appear hereinafter.

It has now been discovered that the above and other objects of the present invention may be accomplished in the following manner. Specifically, a structure having an overlying exposed conductive layer formed thereover is provided. A dielectric layer is formed over the exposed conductive layer. An anti-reflective coating layer is formed over the dielectric layer. The anti-reflective layer and the dielectric layer are etched using a via opening process to form an initial via exposing a portion of the conductive layer. A protective film portion is formed over at least the exposed portion of the conductive layer. The anti-reflective coating layer and the dielectric layer are patterned to reduce the initial via to a reduced via and to form a trench opening substantially centered over the reduced via. The trench opening and the reduced via comprising the dual damascene opening.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

For the purposes of this invention, "low-k" means a dielectric constant of less than about 3.0.

Figure 1:
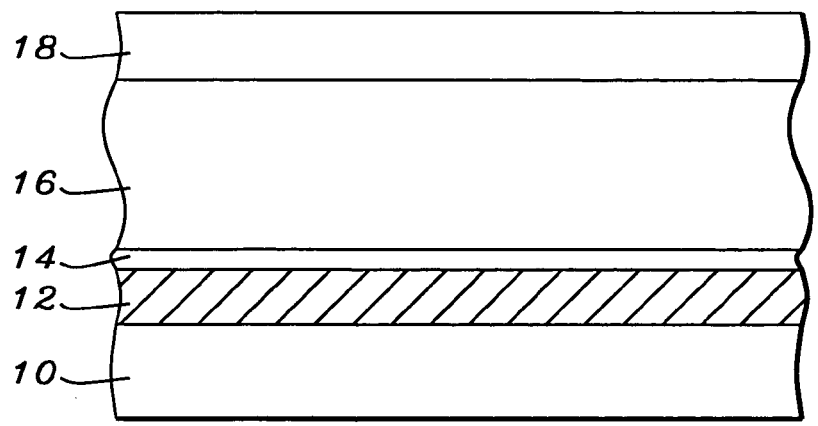
FIGS. 1 to 7 schematically illustrates a preferred embodiment of the present invention.

Initial Structure—FIG. 1

As shown in FIG. 1, structure 10 includes an uppermost metal layer 12 formed thereover to a thickness of preferably from about 3000 to 15,000 Å and more preferably from about 3000 to 8000 Å.

Structure 10 is preferably includes a silicon or germanium substrate and is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

Metal layer 12 is preferably comprised of copper, aluminum, gold or silver and is more preferably copper.

An optional etch stop/liner layer 14 is formed over metal layer 12 to a thickness of preferably from about 50 to 2000 Å and more preferably from about 100 to 1000 Å. Etch stop/liner layer 14 is preferably comprised of the elements Si, O, N and/or C and may be specifically comprised of, for example, $Si_3N_4$, SiOCN, SiOC and SiC.

Porous low-k dielectric layer 16 is formed over optional etch stop/liner layer 14 to a thickness of preferably from about 2000 to 20,000 Å and more preferably from about 2000 to 15,000 Å. Porous low-k dielectric layer 16 has a dielectric constant (k) of preferably less than about 3.0, more preferably from about 1.0 to less than about 3.0 and most preferably from about 1.5 to 2.8 and is preferably comprised of the elements Si, O, C and/or H such as SiOCH.

An anti-reflective coating (ARC) layer 18 may be formed over porous low-k layer 16 to a thickness of preferably from about 50 to 2000 Å and more preferably from about 100 to 1500 Å. ARC layer 18 is preferably comprised of SiON or SiOC and is more preferably SiON.

Figure 2:
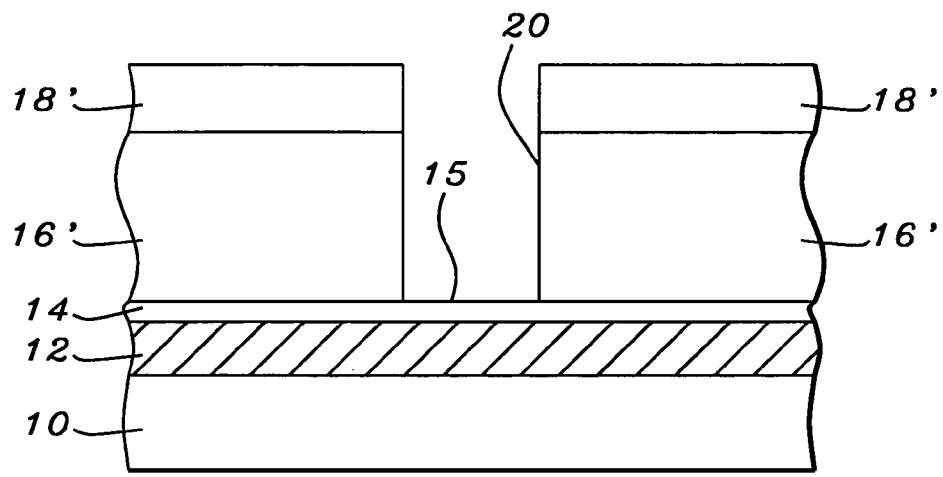

Via Opening Process to Form Initial Via 20—FIG. 2

As shown in FIG. 2, a via opening process is utilized to etch through ARC layer 18 and porous low-k layer 16 to form initial via 20 exposing a portion 15 of etch stop/liner layer 14. The via opening process is preferably a dry etch process employing an F-based plasma and is conducted under the following conditions:

temperature: preferably from about 0 to 200° C. and more preferably from about 0 to 100° C.; pressure: preferably from about 5 to 300 mTorr and more preferably from about 5 to 250 mTorr;

time: preferably from about 10 to 500 seconds and more preferably from about 20 to 300 seconds; and plasma power: preferably from about 0 to 3000 W and more preferably from about 50 to 2500 W.

Since the via opening process is conducted at this point in the processing, there is no surface roughness of the patterned porous low-k dielectric layer 16' as the LRM processing does not affect any remaining horizontal surface of the patterned porous low-k dielectric layer 16'.

Via 20 is preferably from about 200 to 3500 Å wide and is more preferably from about 800 to 2500 Å wide.

Liner Removal Process (LRM): Removal of Exposed Etch Stop/Liner Layer Portion 15—FIG. 3

Figure 3:
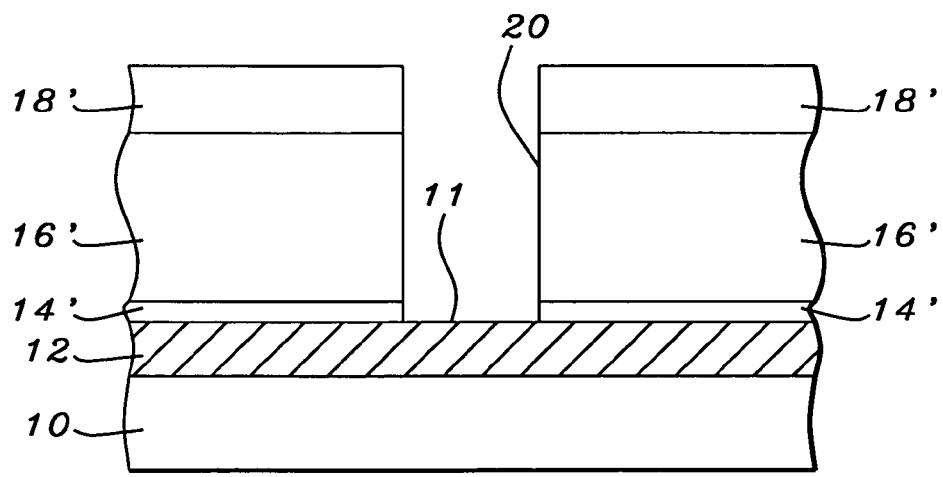

As shown in FIG. 3, the exposed portion 15 of etch stop/liner layer 14 is removed by a liner removal process (LRM) preferably using a dry etch process employing a F-based plasma or a physical bombardment process employing, for example, Ar, He or $N_2$, to expose a portion 11 of metal layer 12.

Figure 4:
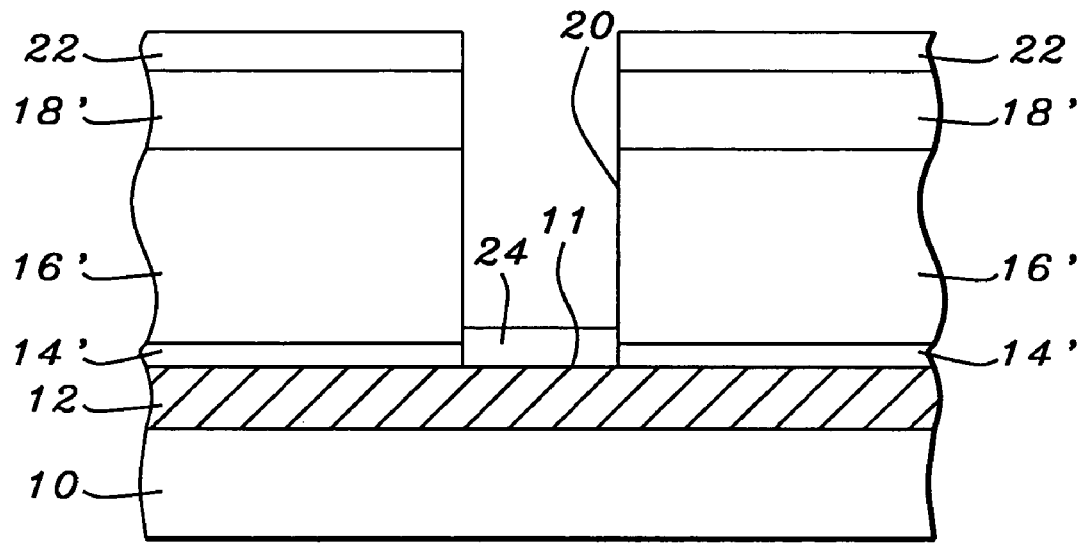

Deposition of Protective Film Portions 22, 24—FIG. 4

As shown in FIG. 4, a protective film is deposited over the structure of FIG. 3 to form protective film portions 22 over the patterned ARC layer 18' and a protective film portion 24 over the exposed portion 11 of metal layer 12.

Protective film portions 22, 24 are preferably comprised of an organic chemical vapor deposition (CVD) film including the elements C, O and H such as $C_xH_y$, and specifically such as, for example, $C_2H_4$ or $C_2H_6$, as will be used for illustrative purposes hereafter, and protective film portion 24 is used to protect the otherwise exposed metal portion thereunder to prevent damage to the metal during subsequent processing.

Organic CVD film portion 24 is formed to a thickness of preferably from about 50 to 2000 Å and more preferably 200 to 1500 Å.

Figure 5:
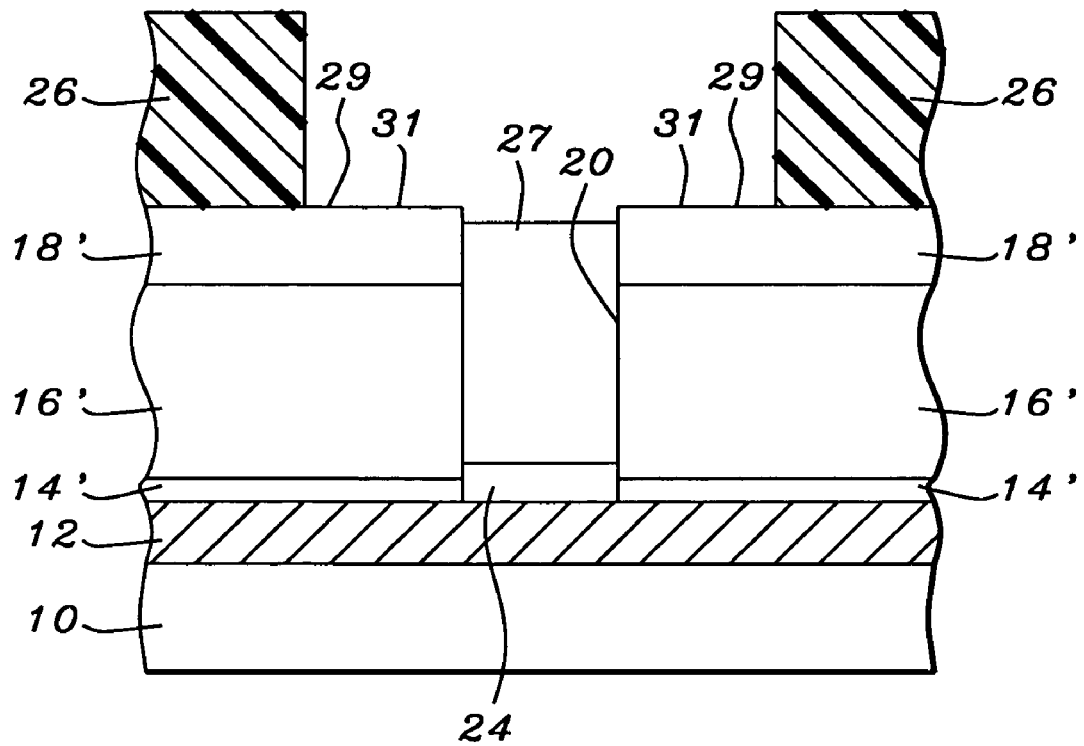

Formation of Via Plug—FIG. 5

As shown in FIG. 5, a via plug 27 is formed within initial via 20 and is preferably comprised of the elements C, H and/or O and may be comprised of conventional resist or BARC materials. Via plug 27 provides protection during the subsequent opening of trench 28 (see below) and assists in the patterning of the photoresist layer 26 (better planarization) (see below).

Via plug 27 may be formed of a via plug material layer and then etched back (along with protective film portion 22 to expose portions 31 of patterned ARC layer 18' as shown in FIG. 5) to leave via plug 27 within initial via 20 as shown in FIG. 5.

Formation of Patterned Masking Layer 26—FIG. 5

As shown in FIG. 5, a patterned masking layer 26 is then formed over exposed portions 29 of patterned ARC layer 18' leaving portions 31 of patterned ARC layer 18' adjacent initial via opening 20 exposed.

Patterned masking layer 26 is preferably photoresist.

Figure 6:
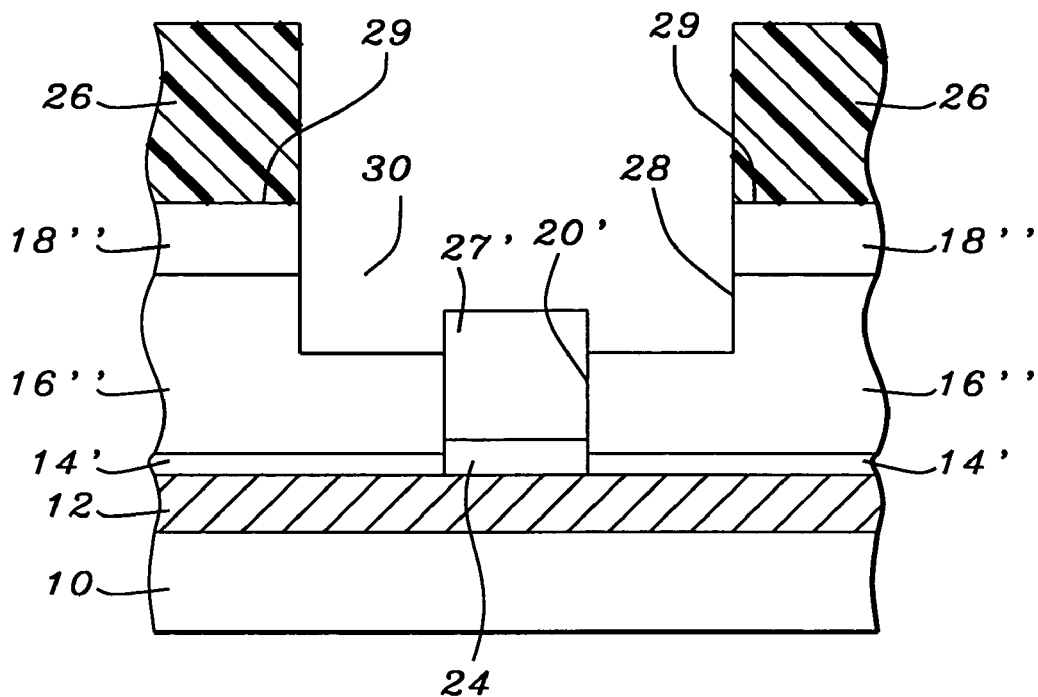

Formation of Trench Opening 28—FIG. 6

As shown in FIG. 6, using patterned masking layer 26 as a mask, the underlying exposed portions 31 of patterned ARC layer 18' adjacent initial via opening 20 and a portion of the underlying patterned porous low-k dielectric layer 16' are removed to form trench opening 28 within twice patterned porous low-k dielectric layer 16" substantially centered over etched via 20'. Trench opening 28 and etched via 20' comprise dual damascene opening 30. Via plug 27 is at least partially consumed during the formation of trench opening 28 leaving a residual portion 27' of via plug 27 remains within etched via 20' as shown in FIG. 6. Alternatively, all of via plug 27 is removed, leaving the protective film portion 24 over the otherwise exposed portion of metal layer 12.

Trench opening 28 is preferably formed using a dry etch process employing an F-based plasma.

Trench opening 28 has a width of preferably from about 5000 Å to 100 μm.

Removal of Patterned Masking Layer 26, Remaining Portion of Via Plug 27 and Organic CVD Film Portion 24

Figure 7:
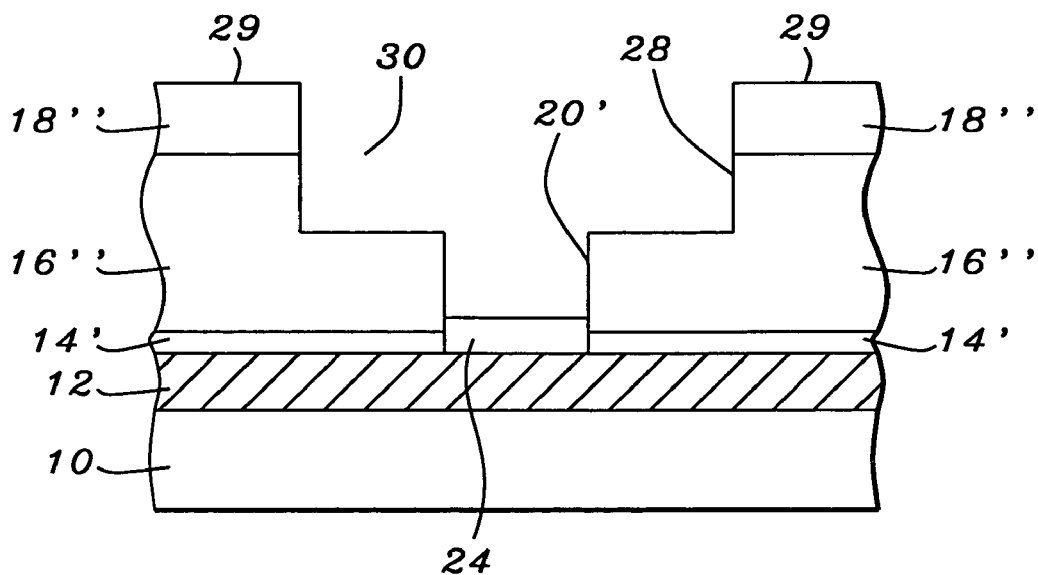

As shown in FIG. 7, patterned masking layer 26, any remaining portion 27' of via plug 27 and the organic CVD film portion 24 are removed, preferably by ashing, and the structure is cleaned as necessary to complete formation of the dual damascene opening 30 without surface roughness.

Further processing may then proceed. For example a dual damascene structure may be formed within dual damascene opening 30 comprised of a metal such as copper, aluminum, gold or silver.

While particular embodiments of the present invention have been illustrated and described, it is not intended to limit the invention, except as defined by the following claims.

We claim:

1. A method of forming a dual damascene opening, comprising the steps of:
   providing a structure having an overlying exposed conductive layer formed thereover;
   forming a dielectric layer over the exposed conductive layer;
   forming an anti-reflective coating layer over the dielectric layer;
   etching the anti-reflective layer and the dielectric layer using a via opening process to form an initial via exposing a portion of the conductive layer;
   forming a protective film portion over at least the exposed portion of the conductive layer, the protective film portion being comprised of the elements C and H; and
   patterning the anti-reflective coating layer and the dielectric layer to reduce the initial via to a reduced via and to form a trench opening substantially centered over the reduced via; the trench opening and the reduced via comprising the dual damascene opening, wherein the structure includes a silicon substrate or a germanium substrate; the conductive layer is comprised of copper, aluminum, gold or silver; the dielectric layer is comprised of the elements Si, O, C and/or H such as SiOCH; and the anti-reflective coating layer is comprised of SiON or SiOC.

2. The method of claim 1, wherein the structure includes a silicon substrate; the conductive layer is comprised of copper; the dielectric layer is comprised of the elements Si, O, C and/or H; the anti-reflective coating layer is comprised of SiON; and the protective film portion is comprised of $C_2H_4$ or $C_2H_6$.

3. A method of forming a dual damascene opening, comprising the steps of:
   providing a structure having an overlying exposed conductive layer formed thereover;
   forming a dielectric layer over the exposed conductive layer;
   forming an anti-reflective coating layer over the dielectric layer;
   etching the anti-reflective layer and the dielectric layer using a via opening process to form an initial via exposing a portion of the conductive layer;
   forming a protective film portion over at least the exposed portion of the conductive layer, the protective film portion being comprised of the elements C and H; and
   patterning the anti-reflective coating layer and the dielectric layer to reduce the initial via to a reduced via and to form a trench opening substantially centered over the reduced via; the trench opening and the reduced via comprising the dual damascene opening, wherein the via opening process is a dry etch process employing an F-based plasma.

4. A method of forming a dual damascene opening, comprising the steps of:
   providing a structure having an overlying exposed conductive layer formed thereover;
   forming a dielectric layer over the exposed conductive layer;
   forming an anti-reflective coating layer over the dielectric layer;
   etching the anti-reflective layer and the dielectric layer using a via opening process to form an initial via exposing a portion of the conductive layer;

forming a protective film portion over the exposed portion of the conductive layer and over the etched anti-reflective coating layer; and patterning the anti-reflective coating layer and the dielectric layer to reduce the initial via to a reduced via and to form a trench opening substantially centered over the reduced via; the trench opening and the reduced via comprising the dual damascene opening.

5. The method of claim 4, wherein a via plug is formed within the initial via before formation of the trench opening.

6. The method of claim 4, wherein a via plug is formed within the initial via before formation of the trench opening; the via plug being comprised of the elements C, H and/or O.

7. The method of claim 4, wherein the formation of trench opening utilizes a patterned masking layer as a mask.

8. The method of claim 4, wherein the formation of trench opening utilizes a patterned photoresist masking layer as a mask.

9. A method of forming a dual damascene opening, comprising the steps of:
    providing a structure having an overlying exposed conductive layer formed thereover;
    forming a dielectric layer over the exposed conductive layer;
    forming an anti-reflective coating layer over the dielectric layer;
    etching the anti-reflective layer and the dielectric layer using a via opening process to form an initial via exposing a portion of the conductive layer;
    forming a protective film portion over at least the exposed portion of the conductive layer, the protective film portion is being comprised of an organic CVD film; and
    patterning the anti-reflective coating layer and the dielectric layer to reduce the initial via to a reduced via and to form a trench opening substantially centered over the reduced via; the trench opening and the reduced via comprising the dual damascene opening.

10. The method of claim 9, wherein the initial via has a width of from about 200 to 3500 Å and the trench opening has a width of from about 5000 Å to 100 µm.

11. The method of claim 9, wherein the initial via has a width of from about 800 to 2500Å and the trench opening has a width of from about 5000 Å to 100 µm.

12. A method of forming a dual damascene opening, comprising the steps of:
    providing a silicon structure having an overlying exposed conductive layer formed thereover; the conductive layer being comprised of copper, aluminum, gold or silver;
    forming a dielectric layer over the exposed conductive layer; the dielectric layer being comprised of the elements Si, O, C and/or H such as SiOCH;
    forming an anti-reflective coating layer over the dielectric layer; the anti-reflective coating layer being comprised of SiON or SiOC;
    etching the anti-reflective layer and the dielectric layer using a via opening process to form an initial via exposing a portion of the conductive layer;
    forming a protective film portion over at least the exposed portion of the conductive layer; the protective film portion being comprised of the elements C and H;
    patterning the anti-reflective coating layer and the dielectric layer to reduce the initial via to a reduced via and to form a trench opening substantially centered over the reduced via; the trench opening and the reduced via comprising the dual damascene opening.

13. The method of claim 12, wherein the conductive layer is comprised of copper; and the anti-reflective coating layer is comprised of SiON.

14. The method of claim 12, wherein the dielectric layer is a porous low-k dielectric layer having a dielectric constant of less than about 3.0.

15. The method of claim 12, wherein the dielectric layer is a porous low-k dielectric layer having a dielectric constant of from about 1.0 to less than about 3.0.

16. The method of claim 12, wherein the dielectric layer is a porous low-k dielectric layer having a dielectric constant of from about 1.5 to 2.8.

17. The method of claim 12, wherein the conductive layer has a thickness of from about 3000 to 15,000 Å; the dielectric layer has a thickness of from about 2000 to 20,000 Å; the anti-reflective coating layer has a thickness of from about 50 to 2000 Å; and the protective film portion has a thickness of from about 50 to 2000 Å.

18. The method of claim 12, wherein the conductive layer has a thickness of from about 3000 to 8000 Å; the dielectric layer has a thickness of from about 2000 to 15,000 Å; the anti-reflective coating layer has a thickness of from about 100 to 1500 Å; and the protective film portion has a thickness of from about 200 to 1500 Å.

19. The method of claim 12, wherein the via opening process is a dry etch process employing an F-based plasma.

20. The method of claim 12, wherein the via opening process is conducted under the following conditions:
    temperature: from about 0 to 200° C.;
    pressure: preferably from about 5 to 300 mTorr;
    time: preferably from about 10 to 500 seconds; and
    plasma power: preferably from about 0 to 3000 W.

21. The method of claim 12, wherein the via opening process is conducted under the following conditions:
    temperature: from about 0 to 100° C.;
    pressure: preferably from about 5 to 250 mTorr;
    time: preferably from about 20 to 300 seconds; and
    plasma power: preferably from about 50 to 2500 W.

22. The method of claim 12, including the step of forming an etch stop/liner layer over the exposed conductive layer.

23. The method of claim 12, including the step of forming an etch stop/liner layer over the exposed conductive layer; the etch stop/liner layer having a thickness of from about 50 to 2000 Å and being comprised of the elements Si, O, N and/or C such as $Si_3N_4$ SiOCN, SiOC or SiC.

24. The method of claim 12, including the step of forming an etch stop/liner layer over the exposed conductive layer; the etch stop/liner layer having a thickness of from about 100 to 1000 Å, and being comprised of the elements Si, O, N and/or C such as $Si_3N_4$ SiOCN, SiOC or SiC.

25. The method of claim 12, wherein the protective film portion is also formed over the etched anti-reflective coating layer.

26. The method of claim 12, wherein a via plug is formed within the initial via before formation of the trench opening.

27. The method of claim 12, wherein a via plug is formed within the initial via before formation of the trench opening; the via plug being comprised of the elements C, H and/or O.

28. The method of claim 12, wherein the formation of trench opening utilizes a patterned masking layer as a mask.

29. The method of claim 12, wherein the formation of trench opening utilizes a patterned photoresist masking layer as a mask.

30. The method of claim 12, wherein the initial via has a width of from about 200 to 3500 Å and the trench opening has a width of from about 5000 Å to 100 µm.

31. The method of claim 12, wherein the initial via has a width of from about 800 to 2500 Å and the trench opening has a width of from about 5000 Å. to 100 µm.

32. A method of forming a dual damascene opening, comprising the steps of:

providing a structure having an overlying exposed conductive layer formed thereover;

forming an etch stop/liner layer over the exposed conductive layer;

forming a dielectric layer over the etch stop/liner layer;

forming an anti-reflective coating layer over the dielectric layer;

etching the anti-reflective layer and the dielectric layer using a via opening process to form an initial via exposing a portion of the etch stop/liner layer;

removing the exposed portion of the etch stop/liner layer using a liner removal process to expose a portion of the underlying conductive layer;

forming a protective film portion over at least the exposed portion of the conductive layer;

patterning the anti-reflective coating layer and the dielectric layer to reduce the initial via to a reduced via and to form a trench opening substantially centered over the reduced via; the trench opening and the reduced via comprising the dual damascene opening.

33. The method of claim 32, wherein the structure includes a silicon substrate or a germanium substrate; the conductive layer is comprised of copper, aluminum, gold or silver; the dielectric layer is comprised of the elements Si, O, C and/or H such as SiOCH; the anti-reflective coating layer is comprised of SiON or SiOC; the etch stop/liner layer is comprised of the elements Si, O, N and/or C such as $Si_3N_4$, SiOCN, SiOC or SiC; and the protective film portion is comprised of the elements C, H and O.

34. The method of claim 32, wherein the structure includes a silicon substrate; the conductive layer is comprised of copper; the dielectric layer is comprised SiOCH; the anti-reflective coating layer is comprised of SiON; the etch stop/liner layer is comprised of $Si_3N_4$, SiOCN, SiOC or SiC; and the protective film portion is comprised of $C_2H_4$ or $C_2H_6$.

35. The method of claim 32, wherein the dielectric layer is a porous low-k dielectric layer having a dielectric constant of less than about 3.0.

36. The method of claim 32, wherein the dielectric layer is a porous low-k dielectric layer having a dielectric constant of from about 1.0 to less than about 3.0.

37. The method of claim 32, wherein the dielectric layer is a porous low-k dielectric layer having a dielectric constant of from about 1.5 to 2.8.

38. The method of claim 32, wherein the conductive layer has a thickness of from about 3000 to 15,000 Å; the dielectric layer has a thickness of from about 2000 to 20,000 Å; the anti-reflective coating layer has a thickness of from about 50 to 2000 Å; the etch stop/liner liner has a thickness of from about 50 to 2000 Å; and the protective film portion has a thickness of from about 50 to 2000 Å.

39. The method of claim 32, wherein the conductive layer has a thickness of from about 3000 to 8000 Å; the dielectric layer has a thickness of from about 2000 to 15,000 Å; the anti-reflective coating layer has a thickness of from about 100 to 1500 Å; the etch stop/liner liner has a thickness of from about 100 to 1000 Å; and the protective film portion has a thickness of from about 200 to 1500 Å.

* * * * *